US011762772B2

(12) United States Patent
Huang et al.

(10) Patent No.: US 11,762,772 B2
(45) Date of Patent: Sep. 19, 2023

(54) DATA PROCESSING APPARATUS AND DATA ACCESSING CIRCUIT

(71) Applicant: Realtek Semiconductor Corporation, Hsinchu (TW)

(72) Inventors: Chao-Wei Huang, Hsinchu (TW); Chen-Hsing Wang, Hsinchu (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 56 days.

(21) Appl. No.: 17/489,945

(22) Filed: Sep. 30, 2021

(65) Prior Publication Data

US 2022/0197801 A1   Jun. 23, 2022

(30) Foreign Application Priority Data

Dec. 23, 2020   (TW) .................................. 109145841

(51) Int. Cl.
  *G06F 12/08*     (2016.01)
  *G06F 12/0811*   (2016.01)
  *G06F 12/0846*   (2016.01)
  *H03K 19/173*    (2006.01)
  (Continued)

(52) U.S. Cl.
  CPC ...... *G06F 12/0811* (2013.01); *G06F 12/0238* (2013.01); *G06F 12/0846* (2013.01);
  (Continued)

(58) Field of Classification Search
  CPC ............. G06F 12/0811; G06F 12/0238; G06F 12/0846; G06F 2212/1021; G06F 3/06;
  (Continued)

(56) References Cited

U.S. PATENT DOCUMENTS

| 2003/0028728 A1* | 2/2003 | Ito ....................... G06F 12/0888 |
| | | 711/E12.021 |
| 2015/0089180 A1* | 3/2015 | Yamamura .............. G06F 12/10 |
| | | 711/170 |

(Continued)

FOREIGN PATENT DOCUMENTS

| EP | 1421490 B1 * | 4/2006 | ............... G06F 1/04 |
| WO | WO-2014158156 A1 * | 10/2014 | ......... G06F 12/0804 |

OTHER PUBLICATIONS

Y. S. Lee, "A secondary cache controller design for a high-end microprocessor," in IEEE Journal of Solid-State Circuits, vol. 27, No. 8, pp. 1141-1146, Aug. 1992.*

(Continued)

*Primary Examiner* — Pierre Michel Bataille
(74) *Attorney, Agent, or Firm* — Locke Lord LLP; Tim Tingkang Xia, Esq.

(57) ABSTRACT

A data processing apparatus including a memory circuit and a data accessing circuit is provided, in which the memory circuit includes multiple cache ways configured to store data. In response to a first logic state of an enabling signal, if a tag of an address of an access requirement is the same as a corresponding tag of the multiple cache ways, the data accessing circuit determines that a cache hit occurs. In response to a second logic state of the enabling signal, if the address is within one or more predetermined address intervals specified by the data accessing circuit, the data accessing circuit determines that the cache hit occurs, and if the address is outside the one or more predetermined address intervals, the data accessing circuit determines that a cache miss occurs.

18 Claims, 9 Drawing Sheets

(51) Int. Cl.
*H03K 19/20* (2006.01)
*G06F 12/02* (2006.01)

(52) U.S. Cl.
CPC ......... *H03K 19/1737* (2013.01); *H03K 19/20* (2013.01); *G06F 2212/1021* (2013.01)

(58) Field of Classification Search
CPC ...... G06F 12/02; G06F 3/0611; G06F 3/0638; G06F 3/0679; G06F 3/0688; G06F 12/08; G06F 12/10; G06F 12/0246; G06F 2212/2022; G06F 2212/7208; G06F 2212/7207
See application file for complete search history.

(56) References Cited

U.S. PATENT DOCUMENTS

| | | | |
|---|---|---|---|
| 2016/0055095 A1* | 2/2016 | Faraboschi | G06F 12/0893 711/118 |
| 2020/0174929 A1* | 6/2020 | Heirman | G06F 12/0811 |
| 2020/0218673 A1* | 7/2020 | Parker | G06F 12/1441 |
| 2021/0173772 A1* | 6/2021 | Lu | G06F 12/126 |

OTHER PUBLICATIONS

Wikipedia, "CPU cache", retrieved from https://en.wikipedia.org/wiki/CPU_cache, last edited on Sep. 25, 2021 and retrieved on Sep. 27, 2021.
Tightly-Coupled Memory—arm developer, retrieved from https://developer.arm.com/documentation/ddi0338/g/level-one-memory-system/tightly-coupled-memory, Chapter 7.3, p. 7-12.

\* cited by examiner

DATA PROCESSING APPARATUS AND DATA ACCESSING CIRCUIT

RELATED APPLICATIONS

This application claims priority to Taiwan Application Serial Number 109145841, filed on Dec. 23, 2020, which is herein incorporated by reference in its entirety.

BACKGROUND

Technical Field

The present disclosure relates to a data processing apparatus and a data accessing circuit thereof. More particularly, the present disclosure relates to a data processing apparatus and a data accessing circuit thereof for configuring a cache memory to a tightly coupled memory.

Description of Related Art

A cache is able to be accessed by the processor within one to several cycles, and thus the cache is commonly used to store copies of data needed by the processor to improve the overall computing performance. Nevertheless, the storage space of the cache is limited, important data is evicted to the main memory in some circumstances, which causing the processor to retrieve those data from the main memory with time penalty. Moreover, the addresses of the cache are unknown for the user, and thus the data in the cache cannot be directly accessed for an observation of the execution state of a program.

A tightly coupled memory is also a storage device that can be accessed by the processor in one to several cycles, which makes it suitable for storing codes with strictly limited processing time or data required to be accessed frequently. The storage space of the tightly coupled memory is mapped to a fixed address interval, and thus a replacement of data in the tightly coupled memory is avoided in the normal circumstance. However, because of the fixed address interval, the tightly coupled memory has less elasticity of use, as compared with the cache.

SUMMARY

The disclosure provides a data processing apparatus including a memory circuit and a data accessing circuit, in which the memory circuit includes a plurality of cache ways configured to store data. In response to a first logic state of an enabling signal, if a tag of an address of an access requirement is the same as a corresponding tag of the plurality of cache ways, the data accessing circuit determines that a cache hit occurs. In response to a second logic state of the enabling signal, if the address is within one or more predetermined address intervals specified by the data accessing circuit, the data accessing circuit determines that the cache hit occurs, and if the address is outside the one or more predetermined address intervals, the data accessing circuit determines that a cache miss occurs.

The disclosure provides a data accessing circuit for being coupled with a memory circuit to access the memory circuit, in which the memory circuit includes a plurality of cache ways configured to store data. The data accessing circuit is configured to: in response to a first logic state of an enabling signal, if a tag of an address of an access requirement is the same as a corresponding tag of the plurality of cache ways, determine that a cache hit occurs; in response to a second logic state of the enabling signal, if the address is within one or more predetermined address intervals specified by the data accessing circuit, determine that the cache hit occurs; and in response to the second logic state of the enabling signal, if the address is outside the one or more predetermined address intervals, determine that a cache miss occurs.

It is to be understood that both the foregoing general description and the following detailed description are by examples, and are intended to provide further explanation of the disclosure as claimed.

DETAILED DESCRIPTION

Reference will now be made in detail to the present embodiments of the disclosure, examples of which are illustrated in the accompanying drawings. Wherever possible, the same reference numbers are used in the drawings and the description to refer to the same or like parts.

Figure 1:
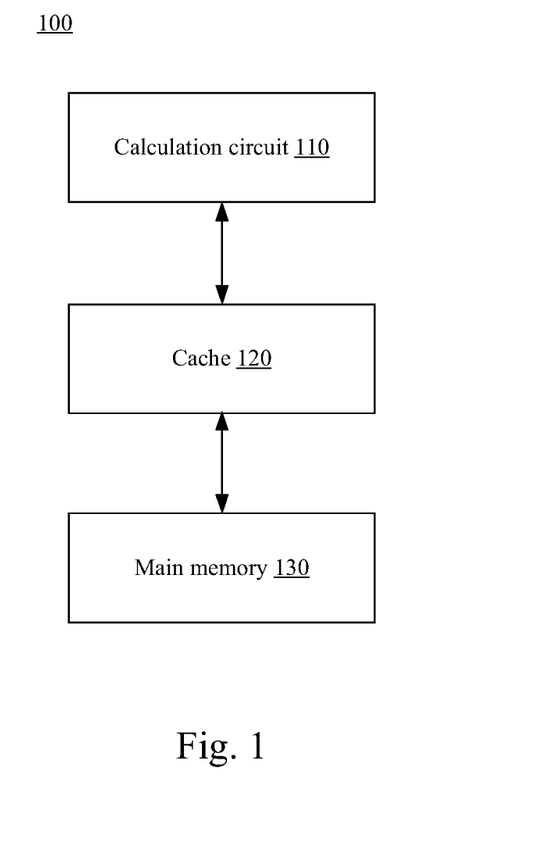
FIG. 1 is a simplified functional block diagram of a data processing apparatus according to one embodiment of the present disclosure.

FIG. 1 is a simplified functional block diagram of a data processing apparatus 100 according to one embodiment of the present disclosure. The data processing apparatus 100 comprises a calculation circuit 110, a cache 120, and a main memory 130, in which the calculation circuit 110 and the cache 120 are coupled with each other through a data transmission interface. The cache 120 and the main memory 130 are also coupled with each other through a data transmission interface. During the operation, the calculation circuit 110 transmits a plurality of read instructions to retrieve data. If a cache hit occurs, it represents that the data to be retrieved by the calculation circuit 110 is stored in the cache 120, and thus the calculation circuit 110 obtains the data directly from the cache 120 to avoid time penalty of accessing the main memory 130.

When the calculation circuit 110 transmits a write requirement, if an address of the write requirement is within a cacheable interval and the cache hit occurs, the calculation circuit 110 directly updates data in the cache 120. If the address of the write requirement is within a write-through interval, corresponding data in the main memory 130 is updated as well. If the address of the write requirement is within a write-back interval, the update to the main memory 130 is temporarily avoided while the updated cache line of the cache 120 is marked as dirty. In following operations, when the dirty cache line is selected to replace data stored therein, the data of the dirty cache line is used to update the main memory 130.

In this embodiment, cache 120 may be a unified cache for storing data and instructions, or may be implemented by a combination of a data cache and an instruction cache. The calculation circuit 110 may be implemented by a single- or multi-core processer, a digital signal processor (DSP), a field programmable gate array (FPGA), etc.

Figure 2:
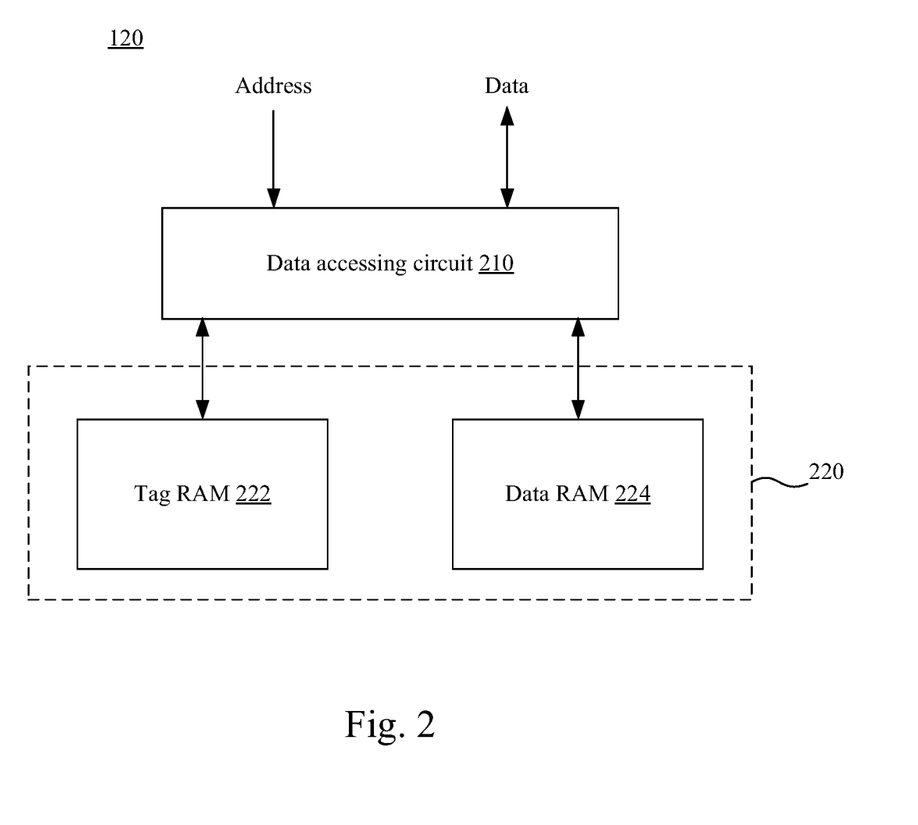
FIG. 2 is a simplified functional block diagram of a cache according to one embodiment of the present disclosure.

FIG. 2 is a simplified functional block diagram of the cache 120 according to one embodiment of the present disclosure. The cache 120 comprises a data accessing circuit 210 and a memory circuit 220 coupled with each other. The data accessing circuit 210 is configured to receive the address of a read requirement transmitted from the calculation circuit 110. The data accessing circuit 210 is also configured to retrieve data from the memory circuit 220 according to the received address, and to return the retrieved data to the calculation circuit 110. When the calculation circuit 110 transmits the write requirement, the data accessing circuit 210 is configured to receive a writing data from the calculation circuit 110, and to store the writing data into the memory circuit 220 according to the address of the write requirement.

The memory circuit 220 may have various implementations, for explanation convenience, the memory circuit 220 is assumed to be implemented by multiple-way set association in this disclosure. In specific, the memory circuit 220 comprises a tag RAM 222 and a data RAM 224. The data accessing circuit 210 compares a tag of the address of the access requirement with tags stored in the tag RAM 222. The data accessing circuit 210 then searches for a corresponding cache line among the data RAM 224 according to the comparison result so as to access data stored in that corresponding cache line.

Figure 3:
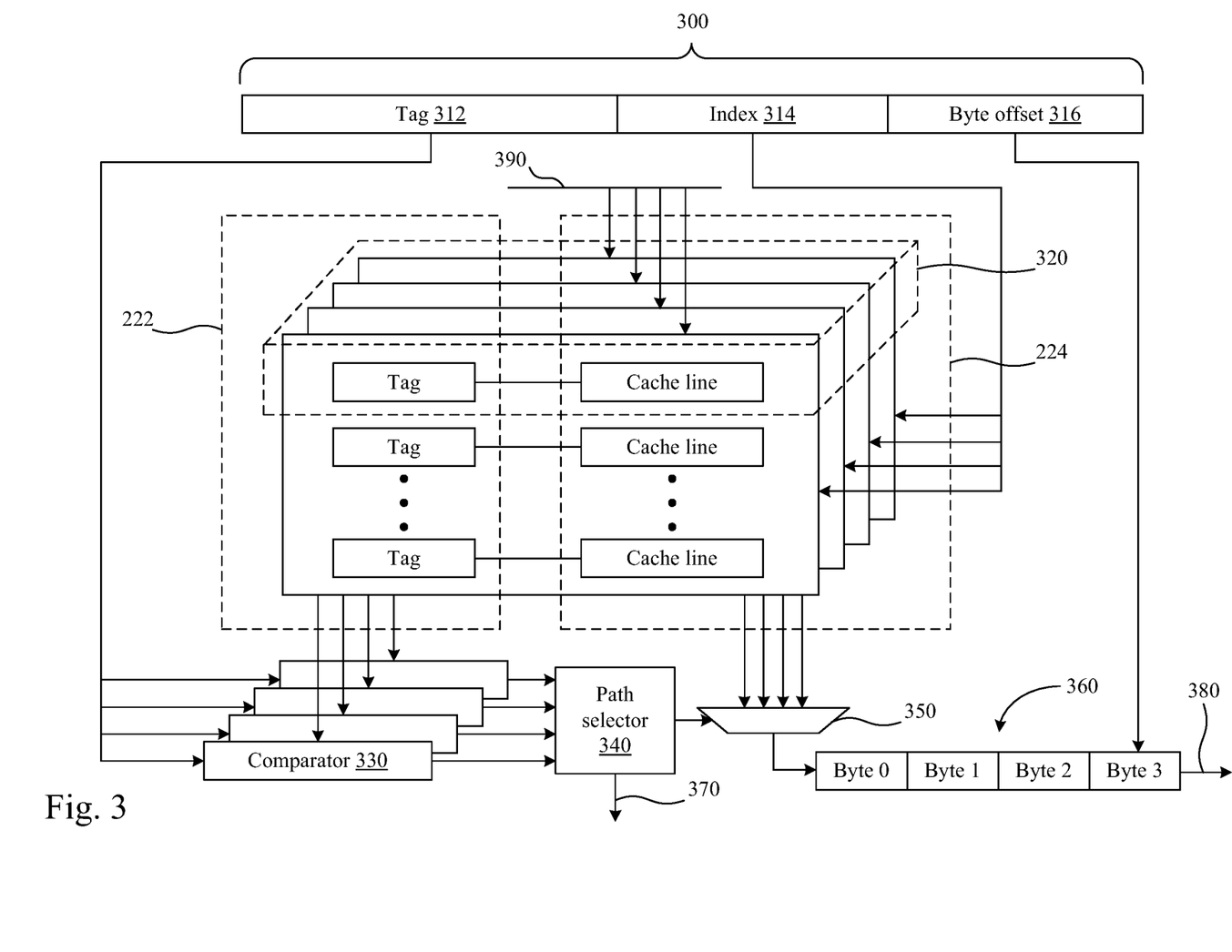
FIG. 3 is a schematic diagram for illustrating a search for a target cache line performed by a data accessing circuit.

FIG. 3 is a schematic diagram for illustrating a search for a target cache line performed by the data accessing circuit 210. As shown in FIG. 3, an address 300 of the access requirement comprises a plurality of fields, such as a tag 312, an index 314, and a byte offset 316. The tag RAM 222 comprises four cache ways, and each way of the tag RAM 222 stores a plurality of tags. The data RAM 224 also comprises four cache ways, and each way of the data RAM 224 comprises a plurality of cache lines configured to store data. In addition, since the memory circuit 220 is configured as multiple-way set association, the memory circuit 220 comprises a plurality of cache sets 320. Each cache way of the tag RAM 222 has one tag that is comprised by a corresponding cache set 320, and each cache way of the data RAM 224 has a cache line comprised by that corresponding cache set 320. That is, each cache set 320 comprises four tags and four cache lines. The tags in the cache set 320 are related to the cache lines in the cache set 320, respectively. When any tag of the cache set 320 is determined to be the same as the tag 312 of the access requirement, it represents that the cache hit occurs and the related cache line will be accessed.

In specific, the index 314 of the access requirement is used to identify a specific cache set 320. Then, the plurality of tags of the cache set 320 are transmitted to the plurality of comparators 330, respectively, so that each of the plurality of tags is compared with the tag 312 of the access requirement. In accordance to outputs of the plurality of comparators 330, the path selector 340 instructs the multiplexer 350 to select one of the cache lines of the cache set 320 to output data 360 stored in that cache line. In this case, if any tag of the cache set 320 is the same as the tag 312 of the access requirement, the path selector 340 informs the calculation circuit 110 through path 370 that the cache hit occurs. In some embodiments, the comparator 330, the path selector 340, and the multiplexer 350 may be integrated in the data accessing circuit 210.

Since a cache line usually has a storage capacity of multiple bytes (e.g., the byte 0, byte 1, byte 2, and byte 3 shown in FIG. 3), the byte offset 316 of the access requirement may be used to specify one of the bytes of the data 360 (e.g., the byte 3). In a situation that the address 300 is corresponding to the read requirement, the specified byte is transmitted to the calculation circuit 110 through a path 380. On the other hand, in a situation that the address 300 is corresponding to the write requirement, the cache set 320 may receive the writing data from the calculation circuit 110 through a path 390, and store the writing data in the cache line thereof.

Figure 4:
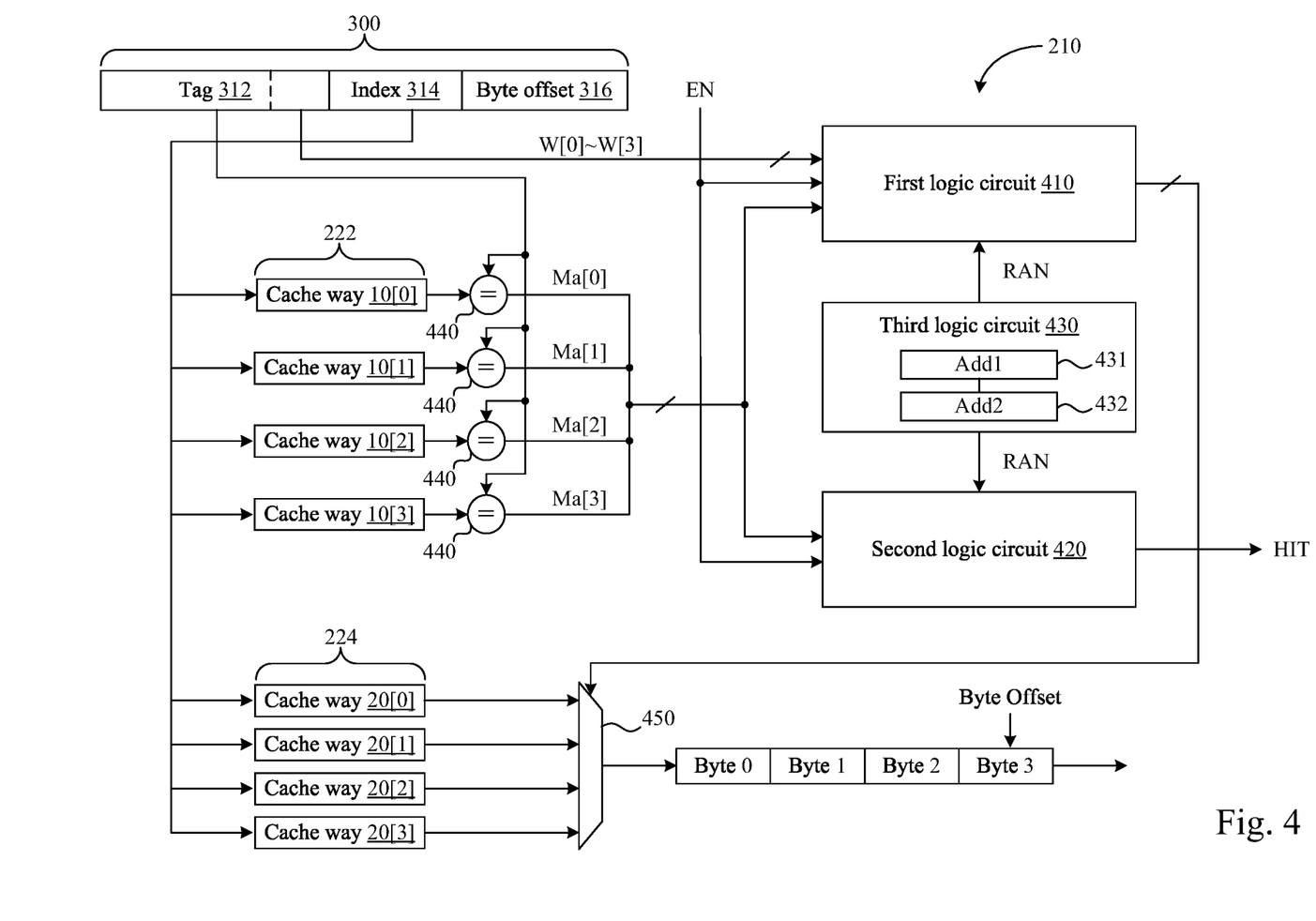
FIG. 4 is a simplified functional block diagram of the data accessing circuit according to one embodiment of the present disclosure.

FIG. 4 is a simplified functional block diagram of a data accessing circuit 210 according to one embodiment of the present disclosure. The data accessing circuit 210 comprises a first logic circuit 410, a second logic circuit 420, a third logic circuit 430, a plurality of comparators 440, and a multiplexer 450, but this disclosure is not limited thereto. In some embodiments, the comparator 440 and the multiplexer 450 may be implemented by circuits different from the data accessing circuit 210. The first logic circuit 410 and the second logic circuit 420 are configured to exam, according to the address 300 of the access requirement, tags stored in a plurality of cache ways 10[0]-10[3] of the tag RAM 222, so as to search a related cache line of a plurality of cache ways 20[0]-20[3] of the data RAM 224.

When the enabling signal EN has a first logic state (e.g., logic 0), the first logic circuit 410 and the second logic circuit 420 may operate the tag RAM 222 and the data RAM 224 as a cache memory in response to the access requirement. That is, the tag RAM 222 and the data RAM 224 can be accessed by the access requirement having an arbitrary address. On the other hand, when the enabling signal EN has a second logic state (e.g., logic 1), the first logic circuit 410 and the second logic circuit 420 may operate the tag RAM 222 and the data RAM 224 as a tightly coupled memory in response to the access requirement. That is, the tag RAM 222 and the data RAM 224 only can be accessed by the access requirement having a specific address. An operation of the data accessing circuit 210 under the circumstance that the enabling signal EN having the first logic state will be described in the following paragraphs based on an assumption that the first logic state of the enabling signal EN represents that the enabling signal EN is logic 0.

Figure 5:
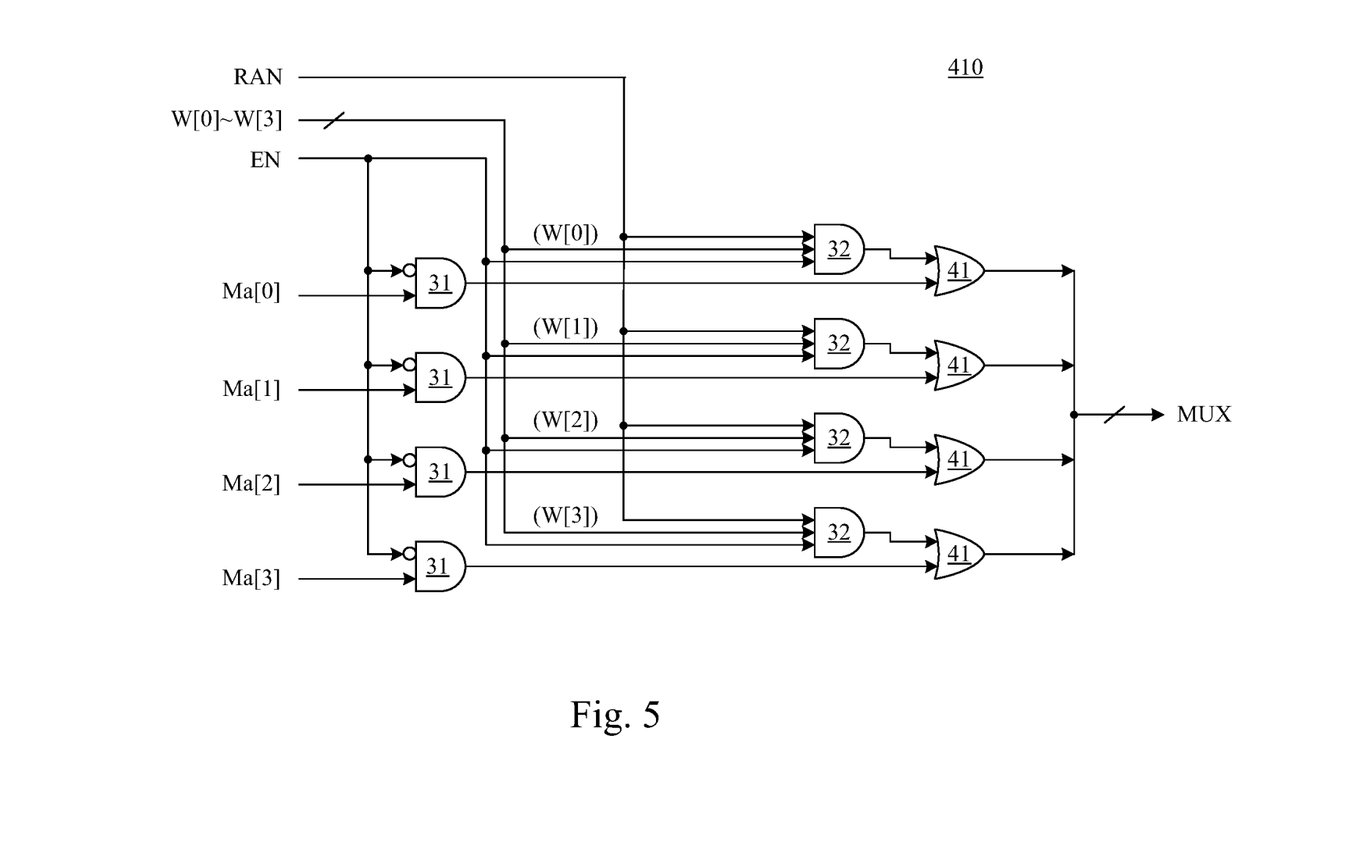
FIG. 5 is a simplified functional block diagram of a first logic circuit according to one embodiment of the present disclosure.

FIG. 5 is a simplified functional block diagram of the first logic circuit 410 according to one embodiment of the present disclosure. Reference is made to FIG. 4 and FIG. 5. First, the data accessing circuit 210 identifies a target cache set among the tag RAM 222 and the data RAM 224 according to the index 314 of the address 300. The comparators 440 are related to the cache ways 10[0]-10[3] of the tag RAM 222, respectively, and the comparators 440 are configured to compare the tag 312 of the address 300 with tags of the target cache set stored in the cache ways 10[0]-10[3]. The comparison signals Ma[0]-Ma[3] outputted by the comparators 440 to the first logic circuit 410 respectively corresponds to comparison results of the cache ways 10[0]-10[3]. For example, if a tag of the target cache set stored in the cache way 10[0] is different from the tag 312 of the address 300, the comparison signal Ma[0] is set to logic 0. As another example, if a tag of the cache set stored in the cache way 10[0] is the same as the tag 312 of the address 300, the comparison signal Ma[0] is set to 1, and so forth.

The first logic circuit 410 comprises a plurality of first AND gates 31, a plurality of second AND gates 32, and a plurality of first OR gates 41. The first AND gates 31 are configured to receive an inverse signal of the enabling signal EN, and configured to receive the comparison signals Ma[0]-Ma[3], respectively. In the situation that the enabling signal EN is logic 0, outputs of the first AND gates 31 are the same as the comparison signals Ma[0]-Ma[3], respectively. In addition, since the second AND gates 32 also receive the enabling signal EN, outputs of the second AND gates 32 are logic 0. Each first OR gate 41 is configured to receive the output of a corresponding first AND gate 31 and the output of a corresponding second AND gate 32, and thus outputs of the first OR gates 41 are the same as the comparison signals Ma[0]-Ma[3], respectively. The outputs of the first OR gates 41 are provided as the multiplexing signal MUX to the multiplexer 450, so as to instruct the multiplexer 450 to select a cache line of the target cache set from the cache ways 20[0]-20[3] and to output data of the selected cache line. As aforementioned, the byte offset 316 of the address 300 is used to select a specific byte of the data to provide to the calculation circuit 110, and thus those descriptions are omitted here for the sake of brevity.

Figure 6:
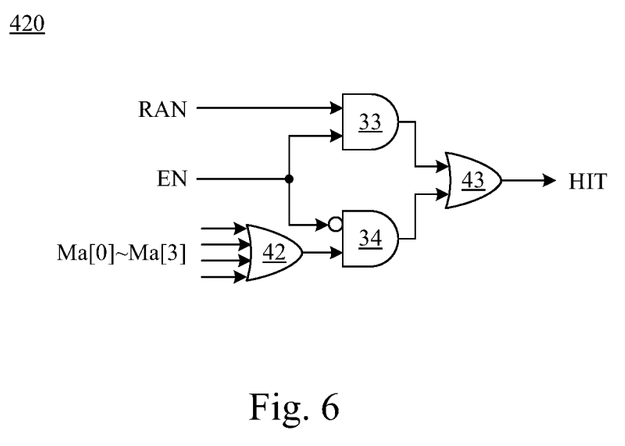
FIG. 6 is a simplified functional block diagram of a second logic circuit according to one embodiment of the present disclosure.

FIG. 6 is a simplified functional block diagram of the second logic circuit 420 according to one embodiment of the present disclosure. Reference is made to FIG. 4 and FIG. 6. The second logic circuit 420 comprises a third AND gate 33, a fourth AND gate 34, a second OR gate 42, and a third OR gate 43. The second OR gate 42 is configured to receive the comparison signals Ma[0]-Ma[3], and is configured to output the result of the OR operation of the comparison signals Ma[0]-Ma[3] to the fourth AND gate 34. The third AND gate 33 and the fourth AND gate 34 are configure to receive the enabling signal EN. Therefore, when the enabling signal EN is logic 0, an output of the third AND gate 33 is logic 0, and an output of the fourth AND gate 34 is the same as the result of the OR operation of the comparison signals Ma[0]-Ma[3]. The third OR gate 43 is configured to receive an output of the third AND gate 33 and an output of the fourth AND gate 34, and thus the third OR gate 43 outputs the result of the OR operation of the comparison signals Ma[0]-Ma[3] as a hit signal HIT. The hit signal HIT is used to inform the calculation circuit 110 that either the cache hit occurs or the cache miss occurs in the cache 120. For example, if the cache miss occurs, the hit signal HIT is set to logic 0. As another example, if the cache hit occurs, the hit signal HIT is set to logic 1.

Accordingly, when the enabling signal EN is logic 0, the tag 312 of the address 300 is the same as a corresponding tag among the cache ways 10[0]-10[3], and the data accessing circuit 210 determines that the cache hit occurs. On the contrary, the data accessing circuit 210 determines that the cache miss occurs. An operation of the data accessing circuit 210 under the circumstance that the enabling signal EN has a second logic state will be described in the following paragraphs based on an assumption that the second logic state of the enabling signal EN represents that the enabling signal EN is logic 1.

Reference is made to FIG. 4 and FIG. 5. When the enabling signal EN is logic 1, the first AND gate 31 outputs logic 0 because of a reception of the inverse signal of the enabling signal EN, that is, the first AND gates 31 blocks the comparison signals Ma[0]-Ma[3]. The second AND gates 32 are configured to receive the selection signals W[0]-W[3], respectively. The selection signals W[0]-W[3] are generated by decoding a plurality of corresponding bits of the tag 312. In some embodiments, a number of these corresponding bits can be generated by the following Formula 1, in which the symbol "M" is the number of the corresponding bits, and the symbol "N" is a number of the cache ways or a number of the selection signals.

$$M=\log_2 N \qquad \text{Formula 1}$$

In the embodiments of FIG. 5, the data accessing circuit 210 decodes two bits of the tag 312 to obtain the four selection signals W[0]-W[3]. For example, if the address 300 comprises 32 bits (bit[31:0]), and if the tag 312 is from the 14-th bit to the 32-th bit (bit[31:13]), the data accessing circuit 210 may decode the 14-th bit to the 15-th bit (bit[14:13]). One of the selection signals W[0]-W[3] may have a logic value different from that of the others. For example, if the bits being decoded are "00," the selection signal W[0] is set to logic 1 while the selection signals W[1]-W[3] are set to logic 0. As another example, if the bits being decoded are "01," the selection signal W[1] is set logic 1 while the selection signals W[0] and W[2]-W[3] are set to logic 0. As yet another examples, if the bits being decoded are "10," the selection signal W[2] is set to logic 1 while the selection signals W[0]-W[1] and W[3] are set to logic 0, and so on.

The address-determination signal RAN generated by the third logic circuit 430 is transmitted to the second AND gate 32. The third logic circuit 430 comprises registers 431 and 432 configured to store an address upper-limit value Add1 and an address lower-limit value Add2, respectively. The third logic circuit 430 is configured to determine whether the address 300 is between the address upper-limit value Add1 and the address lower-limit value Add2. If not, the third logic circuit 430 sets the address-determination signal RAN to logic 0. If so, the third logic circuit 430 sets the address-determination signal RAN to logic 1. However, this disclosure is not limited thereto. In some embodiments, the third logic circuit 430 may generate a first logic state and a second logic state different from each other to respectively indicate whether the address 300 is between the address upper-limit value Add1 and the address lower-limit value Add2 or not, in which the values of the first logic state and the second logic state may be determined according to practical circuit designs. Therefore, if the address-determination signal RAN is set to logic 0, the plurality of second AND gates 32 block the selection signals W[0]-W[3]; and if the address-determination signal RAN is logic 1, outputs of the plurality of second AND gates 32 are the same as the selection signals W[0]-W[3], respectively, and outputs of the plurality of first OR gates 41 are the same as the selection signals W[0]-W[3], respectively.

Accordingly, when the enabling signal EN is logic 0, the first logic circuit 410 outputs the comparison signals Ma[0]-Ma[3] as the multiplexing signal MUX; and when the enabling signal EN and the address-determination signal RAN are both logic 1, the first logic circuit 410 outputs the selection signals W[0]-W[3] as the multiplexing signal MUX to particularly access data of a corresponding one of the cache ways 20[0]-20[3].

Reference is made to FIG. 4 and FIG. 6. When the enabling signal EN is logic 1, the address-determination signal RAN passes through the third AND gate 33 and being transmitted to the second OR gate 43. The fourth AND gate 34 blocks the result of the OR operation of the comparison signals M[0]-M[3]. Therefore, when the address-determination signal RAN is logic 1, the data accessing circuit 210 determines that the cache hit occurs (the hit signal HIT is set to logic 1); and when the address-determination signal RAN is logic 0, the data accessing circuit 210 determines that the cache miss occurs (the hit signal HIT is set to logic 0).

Accordingly, during the development of a program, addresses for storing instructions and data are not yet specified, the user may operate the memory circuit 220 as a cache memory through the data accessing circuit 210 to enable an acceleration function suitable for all address intervals. When the user has determined the addresses for storing the codes or data to be accelerated, the user may operate the memory circuit 220 as a tightly coupled memory through the data accessing circuit 210 to accelerate a specific address interval (i.e., the interval defined by the address upper-limit value Add1 and the address lower-limit value Add2).

When a conventional cache control circuit responses to a write requirement with an address within the write-back interval, if the cache miss occurs, corresponding data in the main memory is loaded into the cache, and then the cache control circuit updates the cache by following rules of the cache hit. In some embodiments, when the data accessing circuit 210 responses to a write requirement with an address within the write-back interval, even if the cache miss occurs, the data accessing circuit 210 avoids loading data in the main memory 130 into the memory circuit 220 and neither stores the writing data of the write requirement into the memory circuit 220. On the contrary, the data accessing circuit 210 directly writes back the writing data to the main memory 130. That is, data in the memory circuit 220 cannot be arbitrarily replaced, thereby further improving acceleration efficiency.

In addition, since the user cannot read a specific storing space of the conventional cache, it is difficult for the user to retrieve temporary files during the execution of a program for debugging. By applying the data accessing circuits 210 of the aforementioned embodiments, the user can switch the memory circuit 220 from the cache memory to the tightly coupled memory during the execution of the program. As a result, the user can easily read files in the cache during the execution of the program by specifying the address.

Figure 7:
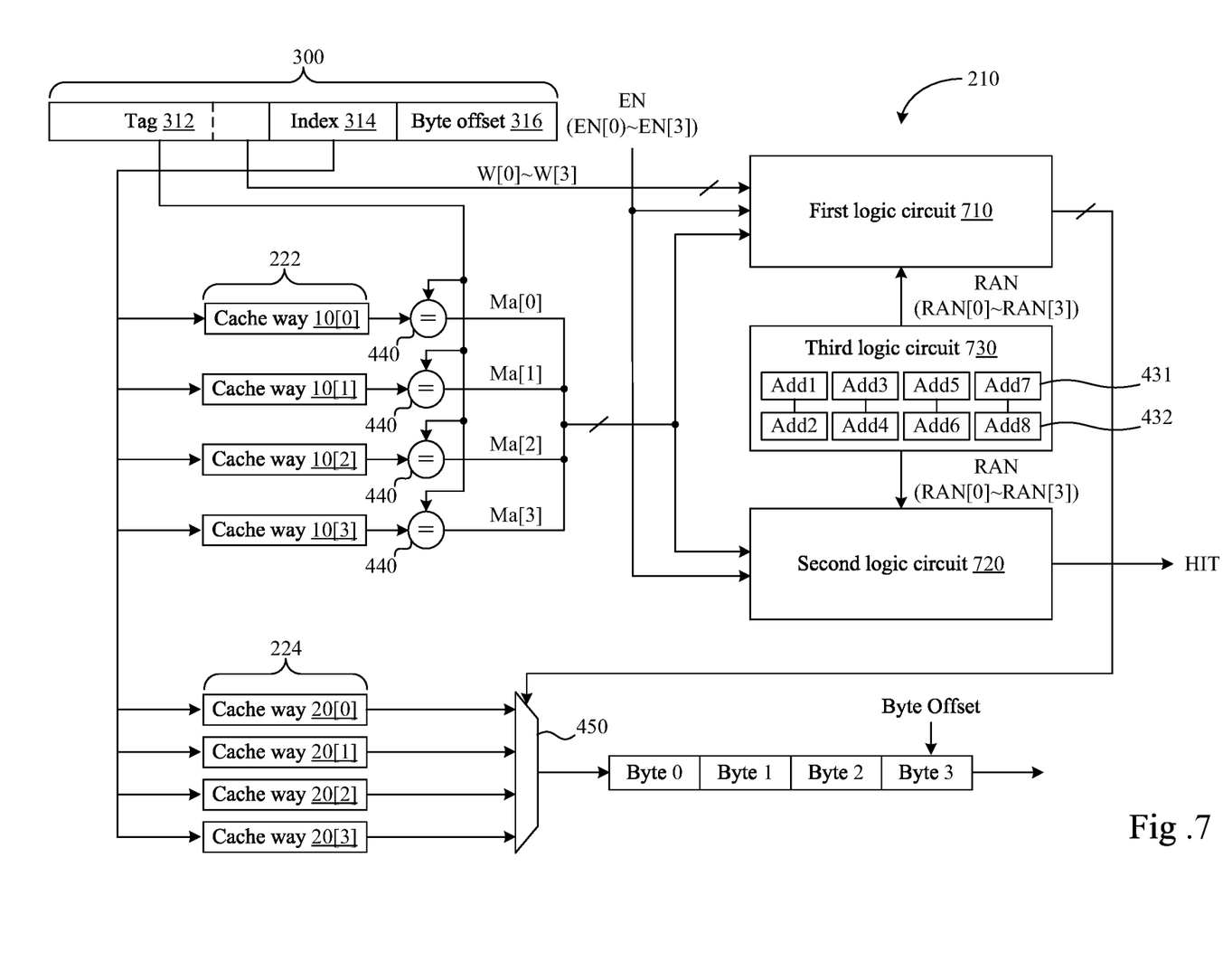
FIG. 7 is a simplified functional block diagram of the data accessing circuit according to another embodiment of the present disclosure.
Figure 8:
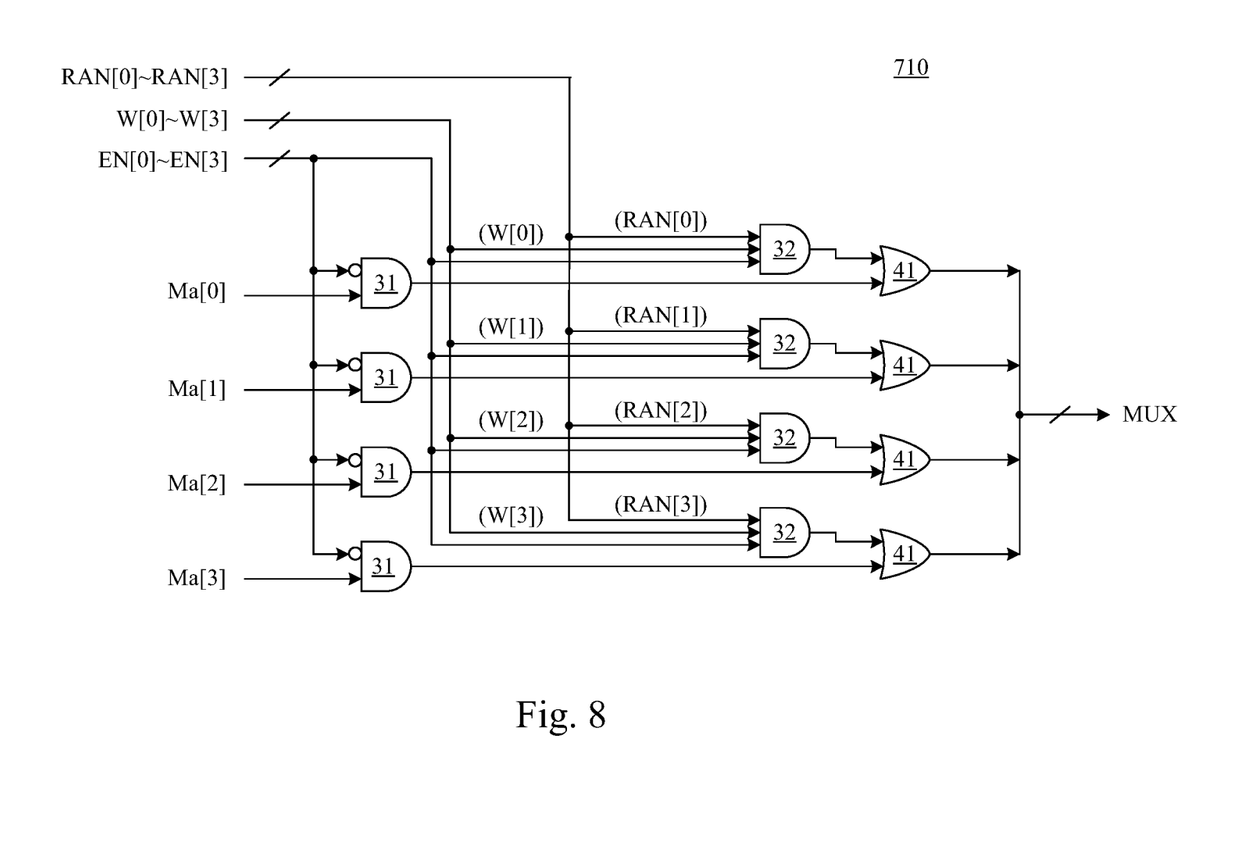
FIG. 8 is a functional block diagram of the first logic circuit according to another embodiment of the present disclosure.

FIG. 7 is a simplified functional block diagram of the data accessing circuit 210 according to another embodiment of the present disclosure. In this embodiment, the data accessing circuit 210 comprises a first logic circuit 710, a second logic circuit 720, and a third logic circuit 730, in which the enabling signal EN comprises a plurality of sub-enabling signals EN[0]-EN[3]. FIG. 8 is a functional block diagram of the first logic circuit 710 according to one embodiment of the present disclosure. As shown in FIG. 8, inverse signals of the sub-enabling signals EN[0]-EN[3] are transmitted to the plurality of first AND gates 31, respectively, and the sub-enabling signals EN[0]-EN[3] are transmitted to the plurality of second AND gates 32, respectively.

Reference is made to FIG. 7 again. The third logic circuit 730 comprises a plurality of registers 431 and a plurality of registers 432. The plurality of registers 431 are configured to store a plurality of address upper-limit values Add1, Add3, Add5, and Add7, respectively. The plurality of registers 432 are configured to store a plurality of address lower-limit values Add2, Add4, Add6, and Add8. The address upper-limit values Add1, Add3, Add5, and Add7 define four address intervals respectively with the address lower-limit values Add2, Add4, Add6, and Add8. The address-determination signal RAN outputted by the third logic circuit 430 comprises a plurality of sub-address-determination signals RAN[0]-RAN[3], in which the sub-address-determination signals RAN[0]-RAN[3] are used to instruct whether the address 300 of the access requirement is within the aforesaid four address intervals, respectively. In some embodiments, the aforesaid four address intervals are not overlapping with each other.

For example, if the address 300 is within an address interval defined by the address upper-limit value Add1 and the address lower-limit value Add2, the sub-address-determination signal RAN[0] is set to logic 1; otherwise the sub-address-determination signal RAN[0] is set to logic 0. As another example, if the address 300 is within an address interval defined by the address upper-limit value Add3 and the address lower-limit value Add4, the sub-address-determination signal RAN[1] is set to logic 1; otherwise the sub-address-determination signal RAN[0] is set to logic 0, and so forth.

Figure 9:
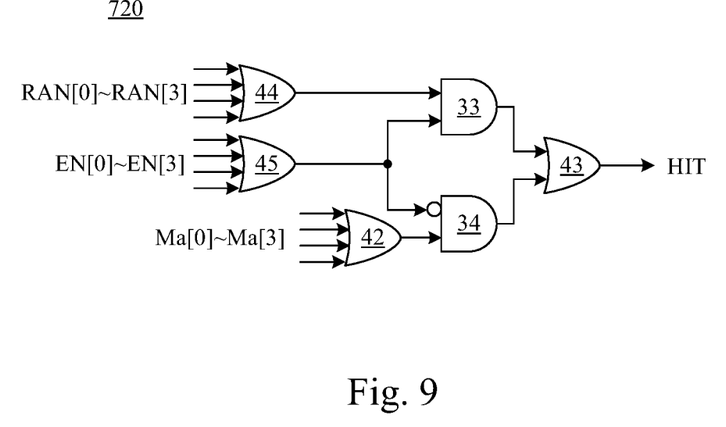
FIG. 9 is a functional block diagram of the second logic circuit according to another embodiment of the present disclosure.

FIG. 9 is a functional block diagram of the second logic circuit 720 according to one embodiment of the present disclosure. The second logic circuit 720 is similar to the second logic circuit 420 of FIG. 6, the difference is that the second logic circuit 720 further comprises a fourth OR gate 44 and a fifth OR gate 45. The fourth OR gate 44 is configured to receive the sub-address-determination signals RAN[0]-RAN[3], and the third AND gate 33 is configured to receive an output of the fourth OR gate 44. The fifth OR gate 45 is configured to receive the sub-enabling signals EN[0]-EN[3], and the third AND gate 33 is configured to receive an output of the fifth OR gate 45. In addition, the fourth AND gate 34 is configured to receive an inverse output of the fifth OR gate 45.

In this embodiment, if the enabling signal EN has a first logic state (e.g., all of the sub-enabling signals EN[0]-EN[3] are logic 0), the data accessing circuit 210 operates the memory circuit 220 as the cache memory. If the enabling signal EN has a second logic state (e.g., one of the sub-enabling signals EN[0]-EN[3] is logic 1), the data accessing circuit 210 operates the memory circuit 220 as the tightly coupled memory. In addition, when the address 300 of the access requirement is not within the aforesaid four address intervals, the address-determination signal RAN has the first logic state (e.g., all of the sub-address-determination signals RAN[0]-RAN[3] are logic 0). When the address 300 of the access requirement is within one of the aforesaid four address intervals, the address-determination signal RAN has the second logic state (e.g., one of the sub-address-determination signals RAN[0]-RAN[3] are logic 1). In addition, the data accessing circuit 210 generates the multiplexing signal MUX according to the selection signals W[0]-W[3].

As can be appreciated from the above descriptions, the data accessing circuit 210 of FIG. 7 can operate the memory circuit 220 as a tightly coupled memory with a plurality of address intervals not overlapping with each other, so as to improve the elasticity of use of the memory circuit 220. The foregoing descriptions regarding the implementations, connections, operations, and related advantages of other corresponding functional blocks in the data accessing circuit 210 of FIG. 4 are also applicable to the data accessing circuit 210 of FIG. 7. For the sake of brevity, those descriptions will not be repeated here.

Certain terms are used throughout the description and the claims to refer to particular components. One skilled in the art appreciates that a component may be referred to as different names. This disclosure does not intend to distinguish between components that differ in name but not in function. In the description and in the claims, the term "comprise" is used in an open-ended fashion, and thus should be interpreted to mean "include, but not limited to." The term "couple" is intended to compass any indirect or direct connection. Accordingly, if this disclosure mentioned that a first device is coupled with a second device, it means that the first device may be directly or indirectly connected to the second device through electrical connections, wireless communications, optical communications, or other signal connections with/without other intermediate devices or connection means.

In addition, the singular forms "a," "an," and "the" herein are intended to comprise the plural forms as well, unless the context clearly indicates otherwise.

Other embodiments of the present disclosure will be apparent to those skilled in the art from consideration of the specification and practice of the present disclosure disclosed herein. It is intended that the specification and examples be considered as exemplary only, with a true scope and spirit of the present disclosure being indicated by the following claims.

What is claimed is:

1. A data accessing circuit, for being coupled with a memory circuit to access the memory circuit, wherein the memory circuit comprises a plurality of cache ways configured to store data, and the data accessing circuit is configured to:
   in response to a first logic state of an enabling signal, if a tag of an address of an access requirement is the same as a corresponding tag of the plurality of cache ways, determine that a cache hit occurs;
   in response to a second logic state of the enabling signal, if the address is within one or more predetermined address intervals specified by the data accessing circuit, determine that the cache hit occurs; and
   in response to the second logic state of the enabling signal, if the address is outside the one or more predetermined address intervals, determine that a cache miss occurs,
   wherein in response to the second logic state of the enabling signal, if the access requirement is a write requirement and the address is within a write-back interval, and if the data accessing circuit determines that the cache miss occurs, the data accessing circuit avoids storing a writing data corresponding to the access requirement into the memory circuit, but directly writes back the writing data to a main memory.

2. The data accessing circuit of claim 1, wherein each of the plurality of cache ways comprises a cache line, the data accessing circuit is for being coupled with a plurality of comparators respectively related to the plurality of cache ways, each comparator is configured to compare the tag of the address with a tag of a corresponding one of the plurality of cache ways, wherein the data accessing circuit is further configured to:
   in response to the first logic state of the enabling signal, provide outputs of the plurality of comparators as a multiplexing signal, wherein the multiplexing signal is configured to specify the cache line of one of the plurality of cache ways, so that data of the cache line is outputted to a calculation circuit; and
   in response to the second logic state of the enabling signal, if the address is within the one or more predetermined address intervals, generate the multiplexing signal according to a plurality of corresponding bits of the address.

3. The data accessing circuit of claim 2, wherein the tag of the address comprises the plurality of corresponding bits of the address.

4. The data accessing circuit of claim 2, comprising:
   a first logic circuit, coupled with the plurality of comparators, and configured to provide, in response to the first logic state of the enabling signal, the outputs of the plurality of comparators as the multiplexing signal, and configured to generate, in response to the second logic state of the enabling signal, the multiplexing signal according to the plurality of corresponding bits of the address when the address is within the one or more predetermined address intervals; and
   a second logic circuit, configured to determine, in response to the first logic state of the enabling signal, either an occurrence of the cache hit or an occurrence of the cache miss according to a result of an OR operation of the outputs of the plurality of comparators, and configured to determine, in response to the second logic state of the enabling signal, either the occurrence of the cache hit or the occurrence of the cache miss according to the address.

5. The data accessing circuit of claim 4, wherein the first logic circuit comprises:
   a plurality of first AND gates, configured to receive an inverse signal of the enabling signal, and configured to receive the outputs of the plurality of comparators, respectively;
   a plurality of second AND gates, configured to receive the enabling signal and an address-determination signal, and configured to respectively receive a plurality of selection signals corresponding to the plurality of corresponding bits of the address, wherein a first logic state of the address-determination signal represents that the address is outside the one or more predetermined address intervals, and a second logic state of the address-determination signal represents that the address is within the one or more predetermined address intervals; and
   a plurality of first OR gates, configured to receive outputs of the plurality of first AND gates, respectively, and configured to receive outputs of the plurality of second AND gates, respectively, wherein the data accessing circuit provides outputs of the plurality of first OR gates as the multiplexing signal.

6. The data accessing circuit of claim 5, wherein the second logic circuit comprises:
   a second OR gate, configured to receive the outputs of the plurality of comparators to generate the result of the OR operation of the outputs of the plurality of comparators;
   a third AND gate, configured to receive the enabling signal and the address-determination signal;
   a fourth AND gate, configured to receive the inverse signal of the enabling signal and an output of the second OR gate; and
   a third OR gate, configured to receive an output of the third AND gate and an output of the fourth AND gate, and configured to output a hit signal, wherein when the hit signal has a first logic value, the data accessing circuit determines that the cache miss occurs, and when the hit signal has a second value, the data accessing circuit determines that the cache hit occurs.

7. The data accessing circuit of claim 5, wherein the address-determination signal comprises a plurality of sub-address-determination signals, and the plurality of second AND gates are configured to receive the plurality of sub-address-determination signals, respectively, wherein the first logic state of the address-determination signal is that the plurality of sub-address-determination signals all have a first logic value, and the second logic state of the address-determination signal is that one of the plurality of sub-address-determination signals has a second logic value.

8. The data accessing circuit of claim 7, wherein the enabling signal comprises a plurality of sub-enabling signals, the plurality of first AND gates are configured to receive a plurality of inverse signals of the plurality of sub-enabling signals, respectively, the plurality of second AND gates are configured to receive the plurality of sub-enabling signals, respectively, wherein the first logic state of the enabling signal is that the plurality of sub-enabling signals all have the first logic value, and the second logic state of the enabling signal is that one of the plurality of sub-enabling signals has the second logic value.

9. The data accessing circuit of claim 8, wherein the second logic circuit comprises:

a fourth OR gate, configured to receive the address-determination signal;

a fifth OR gate, configured to receive the enabling signal;

a second OR gate, configured to receive the outputs of the plurality of comparators to generate the result of the OR operation of the outputs of the plurality of comparators;

a third AND gate, configured to receive an output of the fourth OR gate and an output of the fifth OR gate;

a fourth AND gate, configured to receive an output of the second OR gate and the output of the fifth OR gate; and a third OR gate, configured to receive an output of the third AND gate and an output of the fourth AND gate, and configured to output a hit signal, wherein when the hit signal has the first logic value, the data accessing circuit determines that the cache miss occurs, and when the hit signal has the second logic value, the data accessing circuit determines that the cache hit occurs.

10. A data processing apparatus, comprising:

a memory circuit, comprising a plurality of cache ways configured to store data; and a data accessing circuit;

wherein in response to a first logic state of an enabling signal, if a tag of an address of an access requirement is the same as a corresponding tag of the plurality of cache ways, the data accessing circuit determines that a cache hit occurs;

wherein in response to a second logic state of the enabling signal, if the address is within one or more predetermined address intervals specified by the data accessing circuit, the data accessing circuit determines that the cache hit occurs, and if the address is outside the one or more predetermined address intervals, the data accessing circuit determines that a cache miss occurs, wherein in response to the second logic state of the enabling signal, if the access requirement is a write requirement and the address is within a write-back interval, and if the data accessing circuit determines that the cache miss occurs, the data accessing circuit avoids storing a writing data corresponding to the access requirement into the memory circuit, but directly writes back the writing data to a main memory.

11. The data processing apparatus of claim 10, wherein each of the plurality of cache ways comprising a cache line, and the data processing apparatus further comprises:

a plurality of comparators, respectively related to the plurality of cache ways, wherein each comparator is configured to compare the tag of the address with a tag of a corresponding one of the plurality of cache ways;

wherein in response to the first logic state of the enabling signal, the data accessing circuit provides outputs of the plurality of comparators as a multiplexing signal, the multiplexing signal is configured to specify the cache line of one of the plurality of cache ways, so that data of the cache line is outputted to a calculation circuit;

wherein in response to the second logic state of the enabling signal, if the address is within the one or more predetermined address intervals, the data accessing circuit generates the multiplexing signal according to a plurality of corresponding bits of the address.

12. The data processing apparatus of claim 11, wherein the tag of the address comprises the plurality of corresponding bits of the address.

13. The data processing apparatus of claim 11, wherein the data accessing circuit comprises:

a first logic circuit, coupled with the plurality of comparators, configured to provide, in response to the first logic state of the enabling signal, the outputs of the plurality of comparators as the multiplexing signal, and configured to generate, in response to the second logic state of the enabling signal, the multiplexing signal according to the plurality of corresponding bits of the address when the address is within the one or more predetermined address intervals; and a second logic circuit, configured to determine, in response to the first logic state of the enabling signal, either an occurrence of the cache hit or an occurrence of the cache miss according to a result of an OR operation of the outputs of the plurality of comparators, and configured to determine, in response to the second logic state of the enabling signal, either the occurrence of the cache hit or the occurrence of the cache miss according to the address.

14. The data processing apparatus of claim 13, wherein the first logic circuit comprises:

a plurality of first AND gates, configured to receive an inverse signal of the enabling signal, and configured to receive the outputs of the plurality of comparators, respectively;

a plurality of second AND gates, configured to receive the enabling signal and an address-determination signal, and configured to respectively receive a plurality of selection signals corresponding to the plurality of corresponding bits of the address, wherein a first logic state of the address-determination signal represents that the address is outside the one or more predetermined address intervals, and a second logic state of the address-determination signal represents that the address is within the one or more predetermined address intervals; and a plurality of first OR gates, configured to receive outputs of the plurality of first AND gates, respectively, and configured to receive outputs of the plurality of second AND gates, respectively, wherein the data accessing circuit provides outputs of the plurality of first OR gates as the multiplexing signal.

15. The data processing apparatus of claim 14, wherein the second logic circuit comprises:

a second OR gate, configured to receive the outputs of the plurality of comparators to generate the result of the OR operation of the outputs of the plurality of comparators;

a third AND gate, configured to receive the enabling signal and the address-determination signal;

a fourth AND gate, configured to receive the inverse signal of the enabling signal and an output of the second OR gate; and a third OR gate, configured to receive an output of the third AND gate and an output of the fourth AND gate, and configured to output a hit signal, wherein when the hit signal has a first logic value, the data accessing circuit determines that the cache miss occurs, and when the hit signal has a second logic value, the data accessing circuit determines that the cache hit occurs.

16. The data processing apparatus of claim 14, wherein the address-determination signal comprises a plurality of sub-address-determination signals, and the plurality of second AND gates are configured to receive the plurality of sub-address-determination signals, respectively, wherein the first logic state of the address-determination signal is that the plurality of sub-address-determination signals all have a first logic value, and the second logic state of the address-determination signal is that one of the plurality of sub-address-determination signals has a second logic value.

17. The data processing apparatus of claim 16, wherein the enabling signal comprises a plurality of sub-enabling signals, the plurality of first AND gates are configured to receive a plurality of inverse signals of the plurality of sub-enabling signals, respectively, and the plurality of second AND gates are configured to receive the plurality of sub-enabling signals, respectively, wherein the first logic state of the enabling signal is that the plurality of sub-enabling signals all have the first logic value, and the second logic state of the enabling signal is that one of the plurality of sub-enabling signals has the second logic value.

18. The data processing apparatus of claim 17, wherein the second logic circuit comprises:

a fourth OR gate, configured to receive the address-determination signal;

a fifth OR gate, configured to receive the enabling signal;

a second OR gate, configured to receive the outputs of the plurality of comparators to generate the result of the OR operation of the outputs of the plurality of comparators;

a third AND gate, configured to receive an output of the fourth OR gate and an output of the fifth OR gate;

a fourth AND gate, configured to receive an output of the second OR gate and the output of the fifth OR gate; and a third OR gate, configured to receive an output of the third AND gate and an output of the fourth AND gate, and configured to output a hit signal, wherein when the hit signal has the first logic value, the data accessing circuit determines that the cache miss occurs, and when the hit signal has the second logic value, the data accessing circuit determines that the cache hit occurs.

* * * * *